United States Patent [19]
Hedberg

[11] Patent Number: 5,539,358
[45] Date of Patent: Jul. 23, 1996

[54] OSCILLATING CIRCUIT ARRANGEMENT IMPLEMENTED ON A PRINTED CIRCUIT BOARD USING AN INTEGRATED CIRCUIT

[75] Inventor: Mats O. J. Hedberg, Haninge, Sweden

[73] Assignee: Telefonaktiebolaget L M Ericsson, Stockholm, Sweden

[21] Appl. No.: 357,323

[22] Filed: Dec. 16, 1994

[30] Foreign Application Priority Data

Dec. 28, 1993 [SE] Sweden .................... 9304307

[51] Int. Cl.$^6$ ................................................ H03B 5/36
[52] U.S. Cl. ................... 331/107 A; 331/108 D; 361/772; 361/783
[58] Field of Search ................... 331/107 A, 68, 331/108 C, 108 D; 361/760, 772, 777, 783

[56] References Cited

U.S. PATENT DOCUMENTS

| | | | |
|---|---|---|---|
| 4,325,032 | 4/1982 | Gilden ............................... | 331/107 A |
| 4,372,037 | 2/1983 | Scapple et al. ..................... | 361/400 |
| 4,760,352 | 7/1988 | Ash ................................... | 331/107 A |
| 5,029,267 | 7/1991 | Masuda et al. ..................... | 331/107 A |
| 5,400,221 | 3/1995 | Kawaguchi ......................... | 361/771 |

FOREIGN PATENT DOCUMENTS

| | | |
|---|---|---|
| 217713 | 4/1987 | European Pat. Off. . |
| 241236 | 10/1987 | European Pat. Off. . |
| 495316 | 7/1992 | European Pat. Off. . |
| 527468 | 2/1993 | European Pat. Off. . |
| 2-207601 | 8/1990 | Japan . |

*Primary Examiner*—Siegfried H. Grimm
*Attorney, Agent, or Firm*—Burns, Doane, Swecker & Mathis

[57] ABSTRACT

A component-module-adapted oscillating circuit arrangement adapted to form a signal with a high frequency and a narrow frequency range includes a signal amplifying circuit, a signal generating circuit with a resonance element, required electrical wiring, and required matching network. On one surface of a carrier substrate belonging to the component module, electrically conductive surface sections are formed and distributed in such a way that they can coact in a firm and electrically conductive manner with corresponding contact surfaces of the resonance element. An integrated circuit is attached to the surface sections adjacent to the surface sections intended for the resonance element. This integrated circuit includes the required amplifying circuit. The contact surfaces of the resonance element are connected to the contact surfaces of the carrier substrate by bonding or the like. The integrated circuit includes further signal amplifying and/or signal processing circuits, and contact surfaces of the integrated circuit are connected to contact surfaces of the carrier substrate by bonding or the like.

9 Claims, 2 Drawing Sheets

OSCILLATING CIRCUIT ARRANGEMENT IMPLEMENTED ON A PRINTED CIRCUIT BOARD USING AN INTEGRATED CIRCUIT

BACKGROUND

The present invention relates to an oscillating circuit arrangement that is adapted for a component module, and specifically to the kind of oscillating circuit arrangements that are adapted to produce signals with a high frequency and small frequency span, such as frequencies and/or bit rates within, at least, the MHz or Mbit/s range and above.

Oscillating circuit arrangements of this kind normally comprise an amplifying circuit and the circuit that generates the oscillating signal, usually in the form of an oscillating element, and more specifically an oscillating element with a pronounced resonance frequency, a so-called resonance element or component, with electric wiring and compensating networks or elements, such as inductance elements, as needed.

An oscillating circuit of this kind can preferably be useful as a separate circuit arrangement to be able to generate a synchronizing signal in circuit internal signal processing to one or several signal processing units. It can also be used to generate clock pulses within a communication system, to transmit information carrying signals where the pulses together with data signals can be transmitted from a signal transmitting unit onto a transmission line or in a signal receiving unit.

The invention is based on the principle that in each case the oscillating circuit arrangement is to be supported by a carrier substrate forming a component module where the top layer of the carrier substrate upholds the discrete components of the oscillating circuit arrangement and an integrated circuit arrangement.

Oscillating circuit arrangements of the kind that generate a signal with a chosen high frequency of at least 100 MHz or more and with a small frequency span are earlier known in several different embodiments with regards to chosen components such as oscillating element, chosen circuit arrangement and mechanical disposition. Such an oscillating circuit arrangement can be a part of a phase-locked loop (PLL) system where the oscillating component or element consists of a voltage-controlled oscillator (VCO). Oscillating circuit arrangements where the oscillating component consists of a surface acoustic wave (SAW) component are designated as VCSOs (voltage-controlled SAW oscillators) or VCSO systems.

U.S. Pat. No. 4,760,352 and No. 4,325,032 show and describe examples of oscillating circuits with SAW-elements or -components. Other units are shown and described in European patent publication Nos. EP 0 527 468; EP 0 495 316; EP 0 217 713; and EP 0 241 236; Japanese patent publication No. JP-A- 2 207 601; and U.S. Pat. No. 5,029,267.

An additional oscillating circuit arrangement of this kind, where the complete system or parts of the system can be integrated on one or several receiver circuits, is known as a frequency-controlled SAW oscillator (FCSO) or FCSO system.

Oscillating circuit arrangements can be used in both earlier mentioned VCSO- and FCSO-systems where a SAW-component is used and where the circuit arrangement is based upon a feedback of the frequency of the SAW-component at the resonance frequency of the filter.

Crystal controlled SAW oscillators have also been described, where the crystal, used as an oscillating element, is mounted in its own oscillating unit, adapted to generate the necessary reference frequency to the SAW-component and its oscillator circuit.

Arrangements of this kind are based upon the fact that, at resonance, the SAW-filter component presents a phase shift of 90° between the input and output terminals. The phase-shifted output signal is fed back through an amplifier that is phase-angle adjustable around the resonance frequency at a range of 60° to 120°. The phase variations and the amplifier can easily be operated by a control voltage with these kind of oscillating circuit arrangements. One can thus achieve an accurate frequency and frequency tuning around the resonance frequency of the SAW-filter with the aid of such a control voltage.

A SAW-component is characterized by a very narrow frequency span, with typically a few-percent deviation, depending on the chosen type of SAW-component, and a very pure frequency with well repressed subharmonics and harmonics. SAW-components have proven suitable for very high oscillating frequencies, frequencies from some tens of MHz to a number of GHz.

Current experience with known voltage-controlled SAW-components used as VCOs and VCSO-oscillators is that these components are, in terms of spatial volume, very large compared to the component modules and/or standard integrated circuits typically used. The function of such an oscillating circuit arrangement requires that the SAW-component, usually together with compensating networks, such as inductance elements, electric wiring and amplifiers as needed, is covered in some kind of casing, such as a ceramic holder with a metal cup, and is thus very expensive, particularly since this casing, because of the sensitivity of the SAW-component, often has to be evacuated and airtight. This technique, and the space that is thereby needed, has resulted in that oscillating circuit arrangements of this kind have only been brought to use in more exclusive circumstances where the various functional requirements are so high, or where the number of units is so low, that the cost is of secondary importance.

For all the above-mentioned oscillating circuit arrangements, one can say that the mechanical disposition of such an oscillating circuit arrangement indicates that the oscillating component, necessary compensating networks, such as inductance elements, electric wiring, amplifiers and so on, is coordinated in a separate evacuated airtight metal or ceramic unit with a metal casing. Such a unit is physically separated and side-oriented from the component module pertaining to other functions such as those used in telecommunication and associated selectors or other equipment. Oscillating circuit arrangements of this kind mounted in such a unit, cover a surface of at least 20×20 mm if not more.

The basic principles of the present invention do not directly depend on the chosen resonance element, but in the following, a SAW-element or SAW-component will exemplify one of several available, and at present most suitable, resonance elements. It will be understood that surface transverse wave (STW) components and surface skimming bulk wave (SSBW) components are intended to be included in the expression "SAW-component".

To further clarify the earlier oscillating circuit arrangements with frequency accuracy, a category called crystal-oscillators, using crystals as oscillating- or resonance-elements, can be mentioned. A crystal oscillator of this kind works in the range of some hundreds of MHz in its keynote, or fundamental frequency, and up to a few hundreds of MHz if one of the harmonics of the crystal is used. Oscillating circuit arrangements with a crystal as a resonance element are used as oscillators and voltage-controlled crystal oscillators (VCXOs). Such oscillators are available as small hole mounted plastic caps and as very small surface mounted multilayer ceramic (MLC) modules. Oscillating circuit arrangements of this kind are, cost-wise, relatively inexpensive, but they have more frequency- and phase-noise (in other words, stronger subharmonics and harmonics) than the SAW-component arrangements and can therefore not produce a frequency with the same purity as the one produced by a SAW-component.

Oscillating circuit arrangements used to generate signals with frequencies in the range of some hundreds of MHz to some GHz use quarter-wave resonators. These are based upon a resonator comprising a conductor, made out of a specific material, with a length that corresponds to a quarter of the wavelength of the resonance frequency.

Oscillating circuit arrangements of the type DCSO (digital control SAW oscillator) use an oscillator controlled by a digital signal. The oscillator is generally a VCSO where the control voltage is generated by a digital-to-analog (D/A) converter. By supplying a digital command to the DCSO, one can get the desired controlled voltage out of the D/A-converter. The D/A-converter can either give an output voltage as a function of input data or it can be a potentiometer controlled by a digital signal to achieve the desired control voltage. A D/A converter or digital trim potentiometer can receive its information in either parallel or serial form. They can obviously be equipped with some kind of memory so that the oscillator can be restarted at a predetermined frequency after, for instance, a power failure.

Considering the known systems described above, it should be regarded as a technical problem to create the conditions where a separately cased oscillating unit is not required and to put components belonging to an oscillator on a component module meant for other functions controlled by the oscillator circuit.

A technical problem resides in being able to see the consequences and importance of limiting the size and number used of discrete cased components, applied to the carrier substrate of the component module.

It is a technical problem to be able to create the circumstances needed to apply discrete components to a carrier substrate and, for such components that normally require airtight casing, to create circumstances so that an airtight casing of the integrated circuits on the carrier substrate is not required.

There is a technical problem to realize the advantages that reside in covering only the resonance element in an airtight casing to form a discrete component and applying this to the carrier substrate of the component module.

Considering the known systems described above, it should be regarded as a technical problem to create such circumstances on a component module so that a necessary SAW-component, necessary matching networks, such as inductance elements, integrated circuits, electric wiring and amplifiers (all of which earlier were coordinated in an evacuated airtight metal casing, physically separated and side-oriented from the component module pertaining to other functions) can be applied to the component module.

There is also a technical problem in being able to create the circumstances on the component module necessary to carry the complete oscillating circuit arrangement, achieving the requirements of a smaller spatial volume and a better coordination between utilized components then earlier known.

It is also a technical problem to create, on a component module, the circumstances necessary to allow the used resonance element (for instance, a SAW-component) and the two matching networks or elements (for instance inductances) to be oriented very close to each other and close to an integrated circuit, comprising among other things necessary amplifiers, and to in this manner create an embodiment that provides electromagnetic protection and electrical wiring with, for high frequencies, small parasitic capacitances.

There is also a technical problem in being able to realize the advantages in allowing the component module to include the functions necessary for a signal receiving circuit to be a part of the earlier mentioned integrated circuit, among other things.

Considering the known systems described above, it must also be seen as a qualified technical problem to be able to create the circumstances necessary to allow the complete oscillating circuit arrangement to be coordinated within a limited part of the surface of a module and to form on a surface area electrically conductive surface sections from the carrier substrate or circuit card belonging to the component module. These surface sections are formed and distributed in a way that they can coact with the corresponding contact surfaces of a resonance element, for instance a SAW-component, in a firm and electrically conductive manner. An integrated circuit, comprising the required signal amplifying circuit and further signal amplifying and/or signal processing circuits, is attached to the surface area adjacent to the surface sections and resonance element. The contact surfaces of the resonance element are connected to the contact surfaces of the carrier substrate by bonding or the like. The contact surfaces of the integrated circuit are connected to the contact surfaces of the carrier substrate by bonding or the like.

It is a technical problem to realize the advantages of adapting the component module to be a signal receiver and to allow the signal amplifying and/or signal processing circuit to be adapted to signal receiving and signal processing.

There is also a technical problem in realizing the advantages of forming further electrically conductive surface sections, from the carrier substrate or circuit card, on a surface area belonging to the component module, these further surface sections being formed and distributed in a way that they can coact with the corresponding contact surfaces of respective impedance elements in a firm and electrically conductive manner and being oriented adjacent to the surface areas belonging to the resonance element.

It is a further technical problem to be able to realize the advantages of orienting the necessary impedance elements adjacent to the resonance element, in the form of a SAW-element, and/or to the integrated circuit or to mount the integrated circuit, a SAW-component, and two impedance elements as discrete elements to the carrier substrate adjacent each other with the electrical wiring implemented on one surface of the carrier substrate so that the SAW-component, or the SAW-component with two impedance elements, is covered by an evacuated airtight casing.

SUMMARY

With the intention of solving one or more of the aforesaid technical problems, the present invention provides an oscillating circuit arrangement that is adapted to a component module and that can have a fundamental frequency higher than 100 MHz. The oscillating circuit arrangement is applicable to a small component module and adaptable to form a signal with a high frequency and a narrow frequency range. The oscillating circuit arrangement comprises a signal amplifying circuit, a signal generating circuit with an oscillating element, any necessary matching network such as needed inductances, and electrical wiring.

With such a component-module-adapted oscillating circuit arrangement, electrically conductive surface sections are formed on a surface area of a carrier substrate. These surface sections are formed and distributed in a way that they can coact in a firm and electrically conductive manner with corresponding contact surfaces of a resonance element. An integrated circuit, comprising the signal amplifying circuit and further signal amplifying and/or signal processing circuits, is attached to the surface area adjacent to the contact surfaces of the matching network and the resonance element. The contact surfaces of the resonance element are connected to the contact surfaces of the carrier substrate by bonding or the like. The contact surfaces of the integrated circuit are connected to the contact surfaces of the carrier substrate by bonding or the like.

In accordance with the invention, the component module may be adapted to a signal receiver and the signal amplifying and/or signal processing circuits adapted to signal receiving or signal processing.

Further, on a surface area of the carrier substrate, four electrically conductive surface sections are formed and distributed in pairs in a way that one pair can coact in a firm and electrically conductive manner with corresponding contact surfaces of a matching network in the form of an impedance element. These four surface sections are oriented adjacent and on each side of the surface sections of the resonance element.

According to the invention, the integrated circuit, resonance element, and matching network may be attached to the carrier substrate adjacent to each other as discrete components, with the electrical wiring implemented mainly on one surface of the carrier substrate and at least the resonance element covered by an evacuated and airtight casing. Also, the resonance element and the matching network can be covered by a ceramic and/or metallic evacuated and airtight casing.

An important advantage afforded by a component-module-adapted oscillating circuit arrangement in accordance with the present invention is that the small surface on a component module covered by the oscillating circuit arrangement makes construction less expensive and power consumption lower. By applying a resonance element covered in an airtight casing as a unit to a component module, a surface area is acquired that is well adapted to other components, where the integrated circuit used does not necessarily have to be in an airtight environment.

BRIEF DESCRIPTION OF THE DRAWINGS

An exemplifying embodiment of an oscillating circuit arrangement comprising features significant to the invention will now be described in more detail with reference to the accompanying drawings, in which.

DETAILED DESCRIPTION

Figure 1:
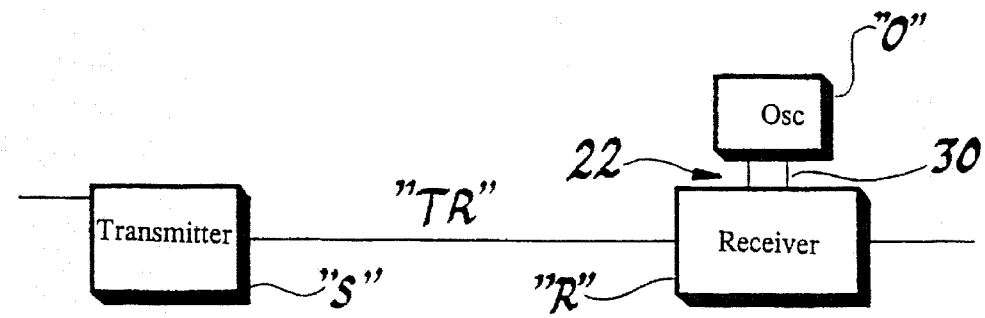
FIG. 1 is a highly schematic figure of a transmitting system for information carrying signals, having a transmitting circuit and a receiving circuit, both comprising an oscillating circuit arrangement according to the present invention.

FIG. 1 illustrates an information carrying signalling system, having a transmitter "S", a receiver "R", and a transmission line "TR" connected therebetween. Both transmitter "S" and receiver "R" require an oscillating circuit arrangement "O" to function. The oscillating circuit arrangement is used to generate clock pulses and to synchronize received pulses of identical form and adapted to the same fundamental frequency.

Required cooperation between transmitter and receiver and their respective oscillating circuit arrangements is known to the art and it is therefore unnecessary to further describe the same. Nevertheless, it shall be mentioned that the pulsed digital data signals transmitted from transmitter "S" are clock-pulse related across the transmission line "TR", and these are received in the receiver "R".

A control voltage is generated by receiver circuits in the receiver "R", and the control voltage is fed through conductor 22 to the oscillating circuit arrangement "O", which in turn feeds a clock signal, in the form of pulses, out on conductor 30. Thus, the oscillating circuit arrangement "O" is a VCO.

Figure 2:
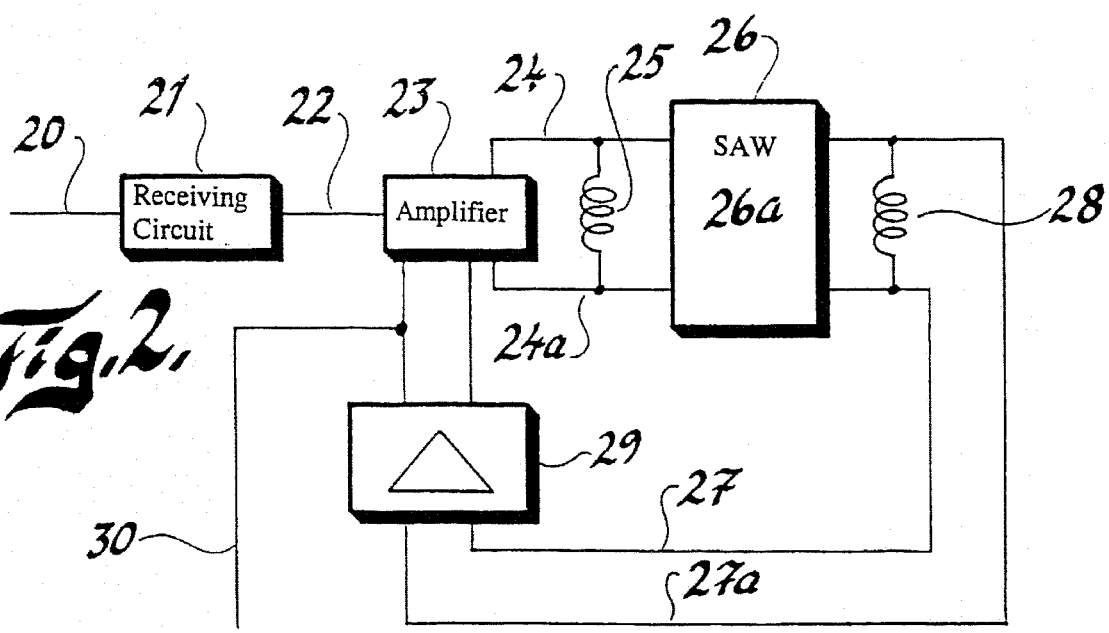
FIG. 2 illustrates the principal construction of an oscillating circuit arrangement.

FIG. 2 illustrates a principal wiring diagram of an oscillating circuit arrangement. A receiving circuit 21 detects signals on a conductor 20 and presents, on its output conductor 22, a signal that is used to control a first amplifier 23 belonging to the oscillating circuit arrangement. The receiving circuit 21 can include a D/A converter. The signal on conductor 22 can be adapted to control a time delay in the amplifier 23, which has two output conductors 24, 24a. A first matching network, illustrated as an inductance 25, and a resonance element 26, which may include a SAW-component 26a of an earlier known construction, are connected to the amplifier's output conductors 24, 24a. Two conductors 27, 27a from the resonance element 26 are connected to each other through a second matching network, illustrated as an inductance 28, and further connected to a second amplifier 29. The desired frequency-stable signal generated is collected through the conductor 30 and can be used as a clock signal in the receiver circuits.

The oscillating circuit arrangement "O", illustrated in FIG. 2, forms a signal having a narrow frequency range and a frequency higher than 100 MHz on the conductor 30. What matching networks 25, 28 to choose depends on the resonance element chosen, which means that even capacitors can be used as matching networks. Using a SAW-component as the resonance element requires inductive elements as the matching networks.

An oscillator of this kind comprises several discrete components: one is the resonance element 26, and two others are the inductances 25 and 28. The presented embodiment indicates that two surface-mounted discrete inductance coils 25' and 28' (see, e.g., FIG. 3) can be used. It is also within the scope of the present invention to position the inductance coils 25 and 28 totally or partly within an integrated circuit. Wiring required between the discrete components is applied partly to a top surface 31a of a carrier substrate 30 (see FIG. 3), and all components, among other things, can be coordinated in an airtight casing.

Figure 3:
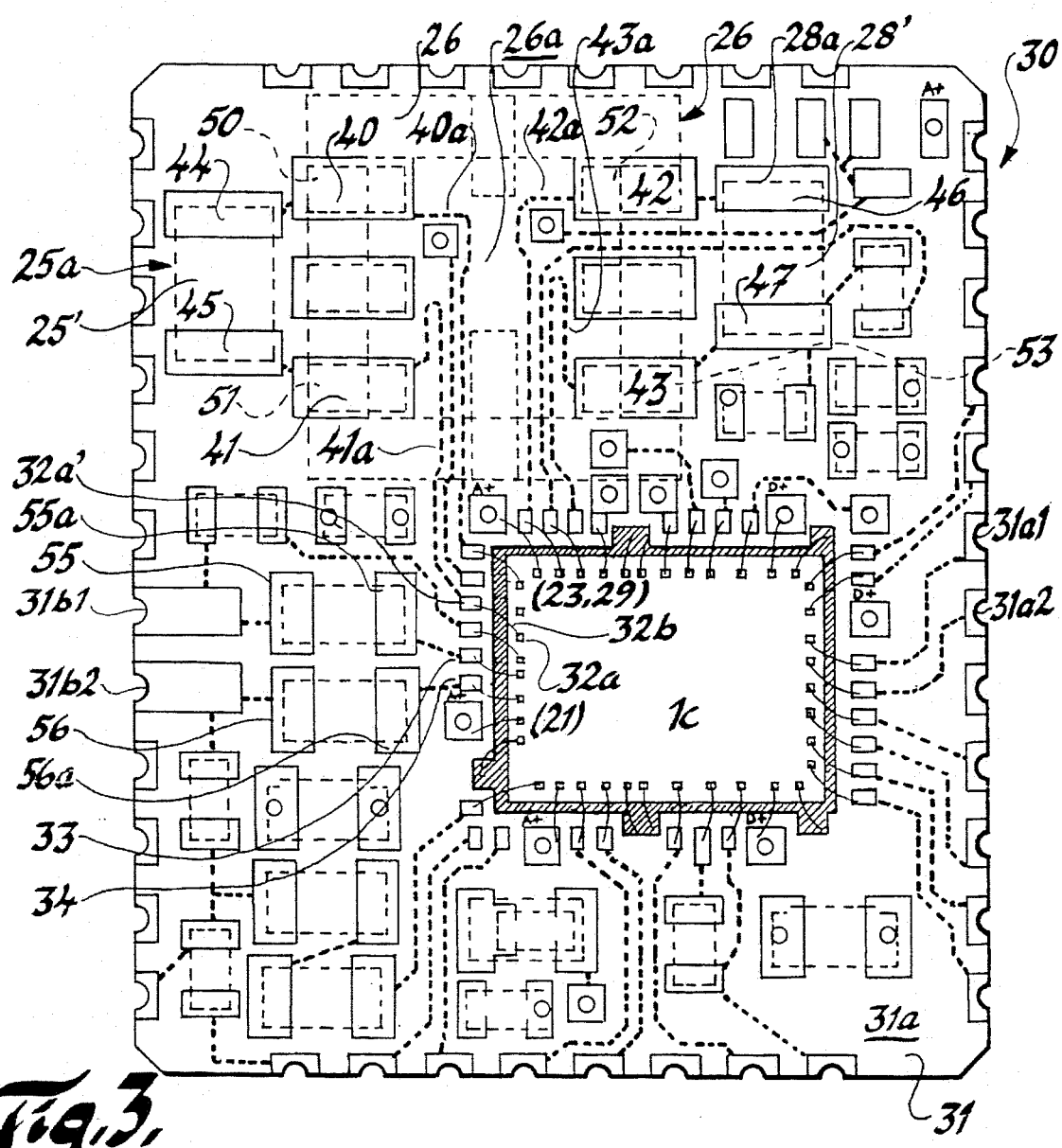
FIG. 3 illustrates, in plan view, the necessary components, circuits and electrical wiring of an oscillating circuit arrangement on an enlarged component module.

Referring to FIG. 3, a complete hybrid oscillator according to FIG. 2 is shown on the component carrier substrate 30, where exclusively the resonance element, or the SAW-component 26a, is covered in an airtight casing. FIG. 3 is meant to more specifically illustrate the top surface 31a of the top layer 31 of a multilayer carrier substrate 30, where the positions and covered surfaces of the discrete components are indicated by dotted lines.

Only a few of the components are significant for understanding the present invention. It can be mentioned that the top surface 31a of the top layer 31 of the carrier substrate 30 is formed with electrically conductive surface sections, connections to some of which are described in the following. Chosen discrete components are attached to these surface sections, and an integrated circuit 32 is attached within an uncovered center area.

The integrated circuit 32 is not covered by an airtight casing and is equipped with a number of side-related contact surfaces oriented in rows, of which one contact surface has been numbered 32a. The top surface 31a is equipped with a number of surface sections oriented in rows, of which one surface section has been numbered 32a'. The contact surface 32a (bond island or bond pad) is connected to the corresponding surface section 32a' by a bonding wire 32b. The surface section 32a' is connected to a conductor 41a, which is terminated with another surface section 41.

Substrate surface sections 40, 41, 42, and 43 are, in the same manner, respectively connected by conductors 40a, 41a, 42a, and 43a to respective surface sections adjacent contact surfaces of the integrated circuit 32. These substrate surface sections are electrically connected to the integrated circuit's contact surfaces by respective bonding wires.

The connections of the integrated circuit 32 to its corresponding surface sections (e.g., 32a') by the bonding wires (e.g., 32b) can be replaced by equivalent means. For instance, the surface sections 32a' can be positioned underneath the corresponding contact surfaces 32a of the integrated circuit, and in known manner, the integrated circuit can be turned over (as a flip chip) for mechanical and electrical contact between the circuit's contact surfaces (bond pads) and the substrate's surface sections.

The carrier substrate 30 can comprise one or several carrier substrate layers 31. It can be constituted of a conventional substrate having at least four layers, for example, a six- or eight-layer substrate, where the top layer 31 is adapted to the mounting of discrete circuits by "chip-on-board" (COB) technology whereafter the carrier substrate, together with the mounted components, can be protected by a drop of plastic or epoxy.

The carrier substrate 30, or component module, illustrated in FIG. 3 is intended for surface mounting, as a discrete component on a larger circuit card that is a part of a selector equipment within a telecommunication system. For this application, the component module 30 is equipped with a number of edge-related contact surfaces, of which two have been numbered 31a1 and 31a2.

Both the component module 30 and the integrated circuit 32 can be surface-mounted in various ways. Because of this, the required connecting pins can be straight and applicable to holes, be "J"-shaped in order to coact with contact surfaces, or be underlying to be brought into contact with upwards facing contact surfaces.

In cooperation, the integrated circuit 32 and SAW-component 26a form an oscillating circuit mounted unto, or surface mounted to, the component module 30. Means for matching impedances of the integrated circuit 32 and resonance element 26, e.g., the compensating inductances, are indicated in FIG. 3 by the discrete components 25' and 28' applied to the top surface 31a of the top layer 31 of the module 30. In this way, a toroid-wound coil, or similar coil, can be given the required, and usually more, number of turns.

Electrically conductive surface sections 40, 41, 42, 43 are formed on the top surface 31a and distributed in a way that they can coact in a firm and electrically conductive manner with corresponding contact surfaces 50, 51, 52, 53 of a cased SAW-component 26a. Techniques for mechanically and electrically connecting the carrier-substrate-related surface sections 40–43 to the unit-related contact surfaces 50–53 are known.

The integrated circuit 32 is attached to the top surface 31a adjacent to the surface sections 41, 43 and very close to the mounted SAW-component 26a. The integrated circuit 32 comprises required signal amplifying circuits (first amplifier 23 and second amplifier 29 shown in FIG. 2) adapted to the oscillating circuit arrangement, and these amplifying circuits are preferably positioned in the upper left corner of the integrated circuit 32. The integrated circuit 32 further comprises signal amplifying and/or signal processing circuits (receiving circuit 21 shown in FIG. 2) with associated contact surfaces, and these contact surfaces are connected to corresponding surface sections on the carrier substrate by bonding wires or the like.

The component module illustrated in FIG. 3 is especially adapted to a signal receiver. Light pulses on an optical transmission line "TR" are convened to electrical pulses by an opto-component or opto-electrical (OE) component (not shown). The electrical pulses arrive at connections 31b1, 31b2, which are both connected through discrete coupling condensers to contact surfaces 55, 55a and 56, 56a, respectively. The contact surfaces 55a and 56a are connected to carrier-substrate-related surface sections 33, 34, and to the integrated circuit 32 by bonding wires or the like. The pulse signals pass through the bonding wires or the like to the integrated circuit 32, and are there processed in the signal amplifying, signal processing, and signal synchronizing circuits in a manner relevant for the system.

In one area of the top surface 31a, a further four electrically conductive surface sections 44, 45 and 46, 47 respectively are formed. These surface sections are formed and distributed in pairs in such a way that each pair can coact in a firm and electrically conductive manner with corresponding contact surfaces of matching impedance elements 25', 28', respectively. These further four surface sections are oriented in pairs adjacent and on each side of the contact surfaces of the SAW-component unit 26. Such impedance elements 25', 28' have the form of discrete components and occupy areas represented by the dotted lines 25a, 28a, respectively, in FIG. 3.

The short length needed for wires between sections 40 and 44, between sections 41 and 45, between sections 42 and 46, and between sections 43 and 47 should be noticed.

The embodiment according to FIG. 3 is intended to illustrate that the integrated circuit 32, the SAW-component unit 26, and the matching impedance elements 25', 28' are attached to the carrier substrate 30 as discrete components adjacent to each other. Electrical wiring required for interconnecting these devices is implemented on one of the surfaces 31a of the carrier substrate.

Figure 4:
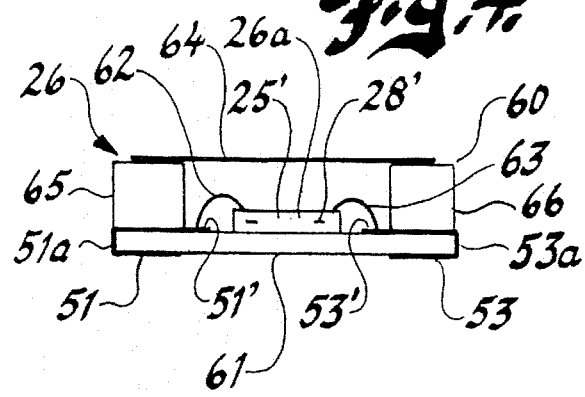
FIG. 4 illustrates, in section view, the covering of a SAW-component in a ceramic casing.

As seen in FIG. 4, the SAW-component unit 26 comprises a ceramic casing 60 covered by a metal cap 64 in an evacuated and airtight manner, and is attached to one of the surfaces 31a of the carrier substrate as a discrete component. The evacuated and airtight casing 60 could also cover both the SAW-component 26a and the two impedance elements 25', 28', and could be attached as a discrete component to one of the surfaces 31a of the carrier substrate. There is nothing to prevent providing the component module 30 with a surrounding collar or the like and enclosing the complete component module underneath an airtight lid as described above but with larger dimensions.

Even if the outer dimensions of the component module 30 can vary within large limits, the technical effect of the invention will increase as the outer dimensions are made smaller, as long as this does not limit the ability to perform normal functions. The outer dimensions of the component module 30 are to correspond to the dimensions of small standard integrated circuits, i.e., 7–15 mm×7–15 min.

Figure 5:
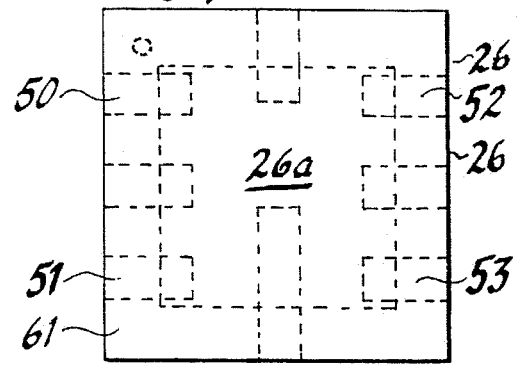
FIG. 5 illustrates, in plan view, the casing according to FIG. 4.

Referring to FIGS. 4 and 5, the ceramic casing 60 with a base plate 61 and side parts 65, 66 is illustrated. Electrical connections, such as connections 50a, 53a, extend from the inside of the base plate, around the edge surface, and toward the bottom surface of the base plate, where they form contact surfaces, such as 50, 53. The SAW-component unit 26 is applied to the base plate 61 and the contact surfaces of the SAW-component 26a are connected to the contact surfaces of the base plate 51', 53' by bonding or the like. Thereafter, the metal cap 64 is applied and the inner space is evacuated, and the cap is attached to the side parts 65, 66 in a known and airtight manner. There is nothing to prevent enclosing the inductances 25', 28' and, if required, even an integrated circuit and required connections to the oscillating circuit within the casing 60. Inductance elements 25', 28' could be enclosed within the base plate 61. The SAW-component 26a is supposed to have an outer limiting surface and to be positioned in the way illustrated in FIG. 3. FIG. 4 and 5 are intended to illustrate the possibility of enclosing even the matching network or the inductance coils 25', 28' within the casing 60.

It will be understood that the invention is not restricted to the aforesaid and illustrated exemplifying embodiments thereof and that modifications can be made within the scope of the following claims.

What is claimed is:

1. A component-module-adapted oscillating circuit arrangement for forming a signal having a high frequency and a narrow frequency range comprising:

an integrated circuit including a signal amplifying circuit and signal processing circuits and having contact surfaces, a signal generating circuit having a resonance element, wherein the resonance element has contact surfaces, at least one matching network having contact surfaces, and a carrier substrate having a surface area where electrically conductive surface sections are formed and distributed in a way such that they can coact in a firm and electrically conductive manner with corresponding contact surfaces of the resonance element and the integrated circuit, the resonance element and integrated circuit being attached to the surface area, wherein the contact surfaces of the resonance element and the contact surfaces of the matching network are positioned adjacent to each other and close to the integrated circuit; the contact surfaces of the resonance element are electrically connected to surface sections of the carrier substrate; and the contact surfaces of the integrated circuit are electrically connected to surface sections of the carrier substrate.

2. The circuit arrangement of claim 1, wherein the component module is adapted to a signal receiver, and the signal amplifying and signal processing circuits are adapted to signal receiving and signal processing.

3. The circuit arrangement of claim 1, wherein on the surface area of the carrier substrate, four electrically conductive surface sections are formed and distributed in pairs in a way such that one pair can coact in a firm and electrically conductive manner with corresponding contact surfaces of the matching network, and the four electrically conductive surface sections are oriented adjacent and in pairs on each side of the surface sections of the resonance element.

4. The circuit arrangement of claim 1, wherein the integrated circuit, the resonance element, and the matching network are attached to the carrier substrate adjacent to each other as discrete components; electrical conductors for electrically connecting the integrated circuit, signal generating circuit, and matching network implemented on the surface of the carrier substrate; and at least the resonance element is covered by an evacuated and airtight casing.

5. The circuit arrangement of claim 1, wherein the resonance element and the matching network are covered by an evacuated and airtight casing.

6. The circuit arrangement of claim 1, wherein the resonance element is a SAW-component.

7. A hybrid oscillator for generating a high frequency signal having a narrow frequency range comprising:

an integrated circuit including first means for amplifying an electrical signal and second means for amplifying an electrical signal and having contact surfaces for providing electrical signals to the first means and second means and for accessing electrical signals generated by the first means and second means;

a SAW-component having contact surfaces for providing electrical signals to the SAW-component and for accessing electrical signals generated by the SAW-component means for matching an electrical impedance of the first means and an input electrical impedance of the SAW-component and for matching an electrical impedance of the second means and an output electrical impedance of the SAW-component, wherein the matching means is electrically connected to the integrated circuit and to the SAW-component through the contact surfaces; and a carrier substrate having a surface area in which electrically conductive surface sections are formed and distributed for electrical connection to respective ones of the contact surfaces of the matching means, SAW-component, and integrated circuit, wherein predetermined ones of the surface sections are electrically interconnected;

wherein the matching means and SAW-component are bonded to respective ones of the surface sections; the SAW-component and matching means are positioned adjacent to each other and close to the integrated circuit on the carrier substrate; and the contact surfaces of the integrated circuit are electrically connected by bonding wires to respective ones of the surface sections of the carrier substrate.

8. A component-module-adapted oscillating circuit arrangement for forming a signal having a high frequency and a narrow frequency range comprising:

an integrated circuit including a signal amplifying circuit and signal processing circuits and having contact surfaces, a signal generating circuit having a resonance element, wherein the resonance element has contact surfaces, at least one matching network having contact surfaces, and a carrier substrate having a surface area where electrically conductive surface sections are formed and distributed in a way such that they can coact in a firm and electrically conductive manner with corresponding contact surfaces of the resonance element and the integrated circuit, the resonance element and integrated circuit being attached to the surface area, wherein the contact surfaces of the resonance element and the contact surfaces of the matching network are positioned adjacent to each other and close to the integrated circuit; the contact surfaces of the resonance element are electrically connected to surface sections of the carrier substrate; and the contact surfaces of the integrated circuit are electrically connected to surface sections of the carrier substrate, and wherein the component module is adapted to a signal receiver, and the signal amplifying and signal processing circuits are adapted to signal receiving and signal processing;

wherein on the surface area of the carrier substrate, four electrically conductive surface sections are formed and distributed in pairs in a way such that one pair can coact in a firm and electrically conductive manner with corresponding contact surfaces of the matching network, and the four electrically conductive surface sections are oriented adjacent and in pairs on each side of the surface sections of the resonance element;

wherein the integrated circuit, the resonance element, and the matching network are attached to the carrier substrate adjacent to each other as discrete components;

electrical conductors for electrically connecting the integrated circuit, signal generating circuit, and matching network implemented on the surface of the carrier substrate; and wherein the resonance element and the matching network are covered by an evacuated and airtight casing.

9. A component-module-adapted oscillating circuit arrangement for forming a signal having a high frequency and a narrow frequency range comprising:

an integrated circuit including a signal amplifying circuit and signal processing circuits and having contact surfaces, a signal generating circuit having a resonance element, wherein the resonance element has contact surfaces, at least one matching network having contact surfaces, and a carrier substrate having a surface area where electrically conductive surface sections are formed and distributed in a way such that they can coact in a firm and electrically conductive manner with corresponding contact surfaces of the resonance element and the integrated circuit, the resonance element and integrated circuit being attached to the surface area, wherein the contact surfaces of the resonance element and the contact surfaces of the matching network are positioned adjacent to each other and close to the integrated circuit; the contact surfaces of the resonance element are electrically connected to surface sections of the carrier substrate; and the contact surfaces of the integrated circuit are electrically connected to surface sections of the carrier substrate, and wherein said resonance element is covered by a casing which does not cover said at least one matching element.

\* \* \* \* \*